US009508752B2

(12) United States Patent
Odaka et al.

(10) Patent No.: US 9,508,752 B2
(45) Date of Patent: Nov. 29, 2016

(54) DISPLAY DEVICE AND METHOD OF MANUFACTURING THE SAME

(71) Applicant: Japan Display Inc., Tokyo (JP)

(72) Inventors: Kazuhiro Odaka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/985,310

(22) Filed: Dec. 30, 2015

(65) Prior Publication Data

US 2016/0181282 A1 Jun. 23, 2016

Related U.S. Application Data

(62) Division of application No. 14/608,036, filed on Jan. 28, 2015, now Pat. No. 9,263,479.

(30) Foreign Application Priority Data

Feb. 6, 2014 (JP) .................................. 2014-021746

(51) Int. Cl.
*H01L 27/14* (2006.01)
*H01L 29/04* (2006.01)
(Continued)

(52) U.S. Cl.
CPC ......... *H01L 27/124* (2013.01); *H01L 27/1222* (2013.01); *H01L 27/1248* (2013.01); *H01L 27/1262* (2013.01); *H01L 27/3244* (2013.01); *H01L 27/3276* (2013.01);
(Continued)

(58) Field of Classification Search
CPC ............. H01L 27/124; H01L 27/1222; H01L 27/1248; H01L 27/3262; H01L 29/78675; H01L 27/3244; H01L 27/3276; H01L 27/3246; H01L 2227/323; H01L 51/5253
USPC .......................................................... 257/72
See application file for complete search history.

(56) References Cited

U.S. PATENT DOCUMENTS

| 2003/0197177 A1* | 10/2003 | Baek ................... H01L 27/1288 |
| | | 257/59 |
| 2003/0197179 A1 | 10/2003 | Yamazaki et al. |

(Continued)

FOREIGN PATENT DOCUMENTS

JP 2008-065135 A 3/2008

OTHER PUBLICATIONS

Taiwanese Office Action, issued Mar. 2, 2016, for corresponding Taiwanese patent Application No. 103143939.

(Continued)

*Primary Examiner* — Dzung Tran
(74) *Attorney, Agent, or Firm* — TYPHA IP LLC

(57) ABSTRACT

A display device includes a display unit including a plurality of pixels respectively including thin film transistors; and a terminal unit including an array of a plurality of terminals. The display device includes a first insulating film provided on a substrate; the thin film transistors provided on the first insulating film; a second insulating film that is provided in the display unit and in the terminal unit and has openings located between the plurality of terminals; a plurality of signal lines that are provided on the second insulating film and are respectively connected to the thin film transistors, and a plurality of terminal lines that are provided on the second insulating film in the terminal unit; and a third insulating film that is located on the plurality of signal lines and the plurality of terminal lines and is formed of an organic insulating film.

9 Claims, 13 Drawing Sheets

(51) Int. Cl.
  *H01L 29/20*   (2006.01)
  *H01L 27/12*   (2006.01)
  *H01L 27/32*   (2006.01)
  *H01L 51/52*   (2006.01)
  *H01L 29/786*  (2006.01)

(52) U.S. Cl.
  CPC .... *H01L 29/78675* (2013.01); *H01L 51/5253* (2013.01); *H01L 27/3246* (2013.01); *H01L 27/3262* (2013.01); *H01L 2227/323* (2013.01)

(56) References Cited

U.S. PATENT DOCUMENTS

| | | |
|---|---|---|
| 2006/0132033 A1 | 6/2006 | Maeda et al. |
| 2007/0075313 A1 | 4/2007 | Kwak et al. |
| 2007/0132374 A1* | 6/2007 | Park ................ H01L 27/3253 313/504 |
| 2007/0134832 A1* | 6/2007 | Oh ........................ B82Y 10/00 438/30 |
| 2007/0176548 A1 | 8/2007 | Kim et al. |
| 2009/0302746 A1* | 12/2009 | Lim ................... H01L 27/3253 313/504 |
| 2011/0080547 A1 | 4/2011 | Matsumori et al. |
| 2011/0241563 A1* | 10/2011 | Kim ..................... G09G 3/3225 315/291 |
| 2014/0209914 A1* | 7/2014 | Nagasawa ............ H01L 27/124 257/72 |

OTHER PUBLICATIONS

Taiwanese Office Action issued on Jun. 28, 2016 for the corresponding Taiwanese Application No. 103143939 with partial English translation.

* cited by examiner

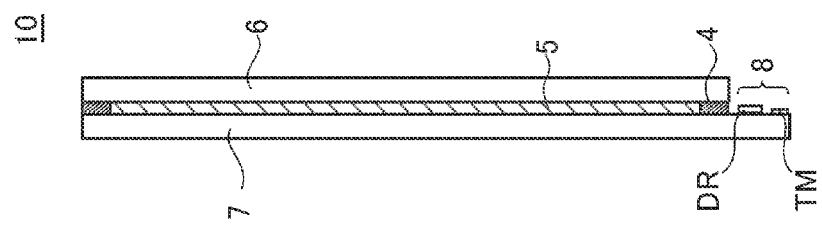
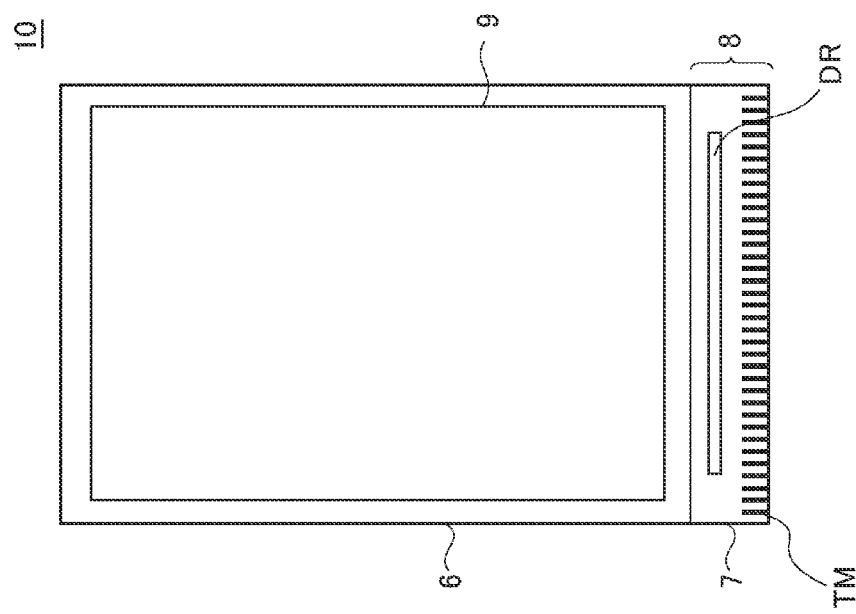

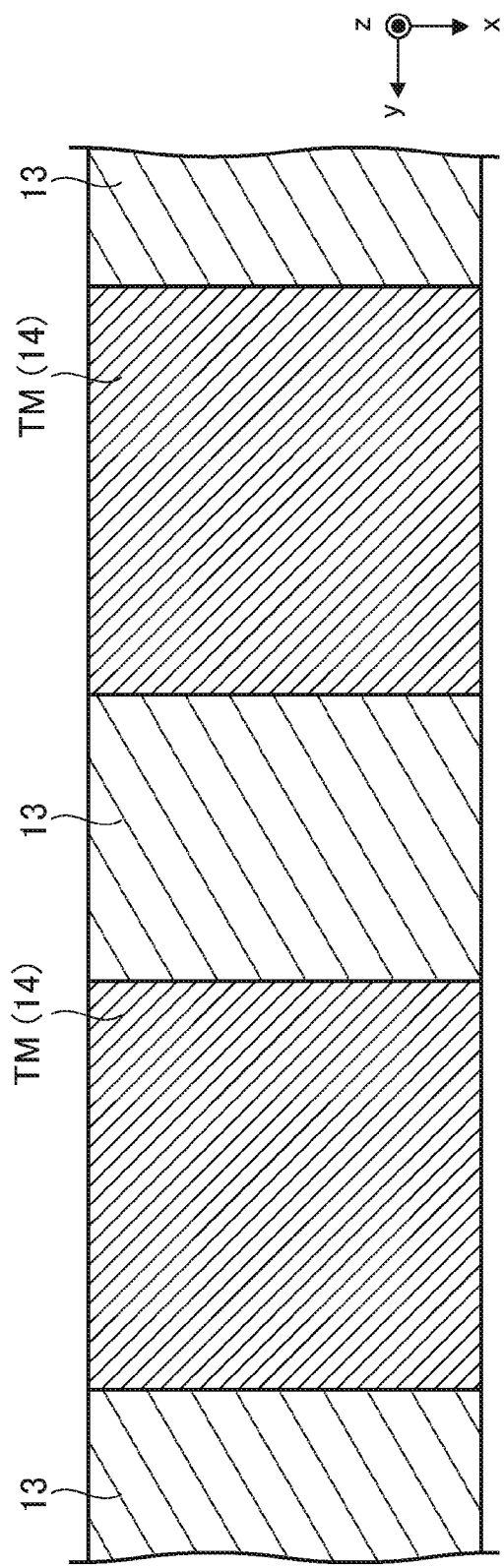

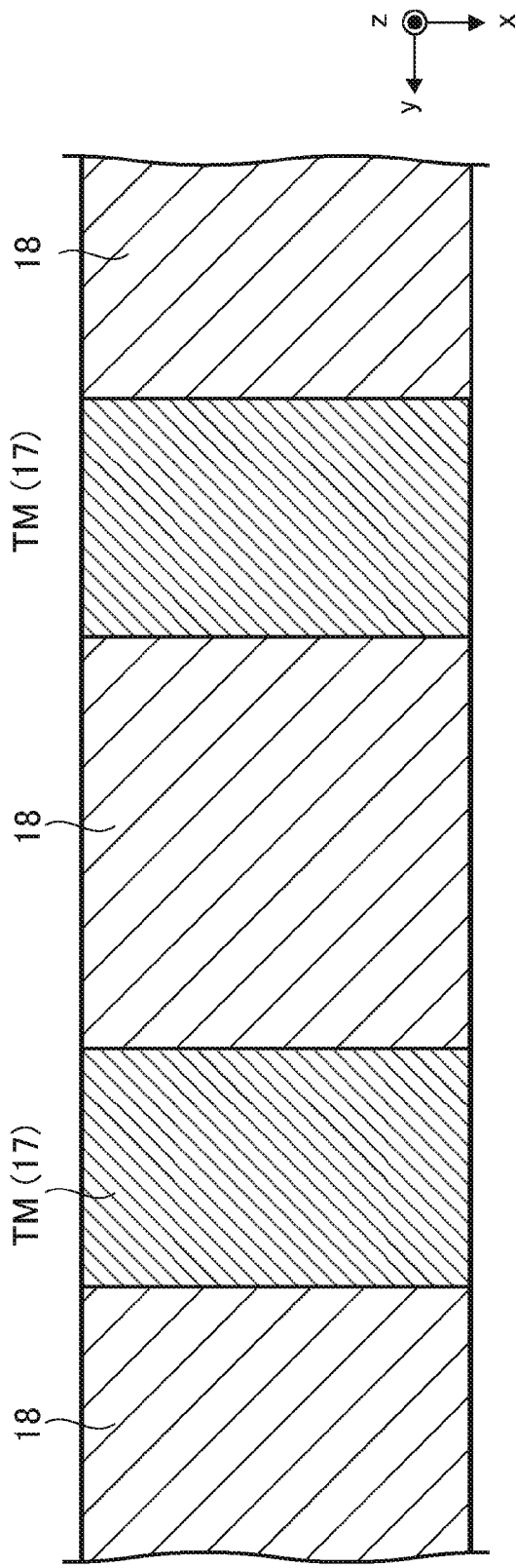

DISPLAY DEVICE AND METHOD OF MANUFACTURING THE SAME

CROSS REFERENCE TO RELATED APPLICATIONS

This application is a divisional application of U.S. patent application Ser. No. 14/608,036, filed on Jan. 28, 2015, which claims the benefit of priority from the Japanese Patent Application No. 2014-021746, filed on 6 Feb. 2014, the entire contents of which are incorporated herein by reference.

FIELD

The present invention relates to a display device including a terminal unit that includes a plurality of terminals, and a method of manufacturing the same.

BACKGROUND

Recently, display devices that control display gray scale of each of a plurality of pixels by use of a thin film transistor (TFT), such as liquid crystal display devices, organic EL (electroluminescence) display devices and the like, have been developed. In such a display device, each of the plurality of the pixels that includes a thin film transistor needs to be supplied with an electric current. For this purpose, the display device includes a terminal unit including a plurality of terminals that are connected to an external circuit or the like and receive the electric current, and a wiring unit including a plurality of lines connected to the plurality of terminals. For such a display device, it is an important issue to prevent deterioration of the terminal unit and the wiring unit to improve the reliability of connection at the terminal unit.

Conventionally in order to realize this, a technology is proposed by which a protrusion is formed in the display device by use of an insulating film in a terminal unit on a substrate including TFTs and the protrusion is used to provide the conduction between the terminal unit and a flexible wiring board (Japanese Laid-Open Patent Publication No. 2008-065135). According to this technology, a thermosetting insulating film is located between a conductive film for terminals that is formed on the protrusion and a bump formed on the flexible wiring board, and the conductive film for terminals and the bump are put into contact with each other via a hole formed in the insulating film, so that the conductance is provided.

However, in the above-described conventional display device, there may possibly be a restriction on the position of the connection part because of the protrusion formed in the terminal unit and the bump formed on an external circuit (flexible wiring board). In this case, the reliability is provided by the insulating film, but the connection resistance may undesirably be high. In addition, since a plurality of minute protrusions need to be formed, the load on the manufacturing process may undesirably be high.

SUMMARY

A method of manufacturing a display device in an embodiment according to the present invention is a method of manufacturing a display device including a display unit that includes a plurality of pixels respectively including thin film transistors, and a terminal unit including an array of a plurality of terminals, signals to control an operation of the thin film transistors respectively being input into the plurality of terminals. The method includes forming a first insulating film on a substrate; forming the thin film transistors on the first insulating film; forming a second insulating film in the display unit and in the terminal unit after the formation of the thin film transistors; forming, in the second insulating film, contact holes that each expose at least a part of a corresponding thin film transistor among the plurality of thin film transistors, while forming a plurality of openings in the second insulating film in the terminal unit; forming, on the second insulating film, a plurality of signal lines respectively connected to the thin film transistors via the contact holes, while forming, on the second insulating film, a plurality of terminal lines with the openings being located therebetween at the same time as the formation of the signal lines; and forming a third insulating film of an organic insulating film on the plurality of signal lines and the plurality of terminal lines.

The method of manufacturing the display device may further include partially removing the third insulating film in the terminal unit to expose a part of each of the plurality of terminal lines; and forming a conductive film that covers the exposed parts of the plurality of terminal lines.

A method of manufacturing a display device in another embodiment according to the present invention is a method of manufacturing a display device including a display unit that includes a plurality of pixels respectively including thin film transistors, and a terminal unit including an array of a plurality of terminals, signals to control an operation of the thin film transistors respectively being input into the plurality of terminals. The method includes forming a first insulating film on a substrate; forming the thin film transistors on the first insulating film; forming a second insulating film in the display unit and in the terminal unit after the formation of the thin film transistors; forming, in the second insulating film, contact holes that each expose at least a part of a corresponding thin film transistor among the plurality of thin film transistors, while forming a plurality of openings in the second insulating film in the terminal unit; forming, on the second insulating film, a plurality of signal lines respectively connected to the thin film transistors via the contact holes, while forming, on the second insulating film, a plurality of terminal lines with the openings being located therebetween at the same time as the formation of the signal lines; forming a third insulating film of an organic insulating film on the plurality of signal lines; forming a fourth insulating film of an inorganic insulating film on the third insulating film and the plurality of terminal lines; partially removing the fourth insulating film in the terminal unit to expose a part of each of the plurality of terminal lines; forming a conductive film that covers the exposed parts of the plurality of terminal lines; forming a fifth insulating film of an organic insulating film on the conductive film; and partially removing the fifth insulating film to expose a part of the conductive film.

The conductive film may be formed of a light-transmissive conductive film.

The third insulating film may be formed of an acrylic resin or polyimide.

A display device in an embodiment according to the present invention includes a display unit including a plurality of pixels respectively including thin film transistors, and a terminal unit including an array of a plurality of terminals, signals to control an operation of the thin film transistors respectively being input into the plurality of terminals. The display device includes a first insulating film provided on a substrate; the thin film transistors provided on the first insulating film; a second insulating film that is provided in the display unit and in the terminal unit and has openings located between the terminals; a plurality of signal lines that are provided on the second insulating film and are respectively connected to the thin film transistors, and a plurality of terminal lines that are provided on the second insulating film in the terminal unit; and a third insulating film that is located on the plurality of signal lines and the plurality of terminal lines and is formed of an organic insulating film.

The plurality of terminals may be respectively connected to the plurality of terminal lines via a plurality of contact holes provided in the third insulating film.

A display device in another embodiment according to the present invention includes a display unit including a plurality of pixels respectively including thin film transistors, and a terminal unit including an array of a plurality of terminals, signals to control an operation of the thin film transistors respectively being input into the plurality of terminals. The display device includes a first insulating film provided on a substrate; the thin film transistors provided on the first insulating film; a second insulating film that is provided in the display unit and in the terminal unit and has openings located between the terminals; a plurality of signal lines that are provided on the second insulating film and are respectively connected to the thin film transistors, and a plurality of terminal lines that are provided on the second insulating film in the terminal unit; a third insulating film that is located on the plurality of signal lines and is formed of an organic insulating film; a fourth insulating film that is formed of an inorganic insulating film located on the third insulating film and the plurality of terminal lines and has a plurality of contact holes that each expose a part of a corresponding terminal line among the plurality of terminal lines; the plurality of terminals provided on the fourth insulating film and are respectively connected to the plurality of terminal lines via the plurality of contact holes; and a fifth insulating film provided on the plurality of terminals and exposes a part of each of the plurality of terminals.

The plurality of terminals may be formed of a light-transmissive conductive film.

The third insulating film may contain an acrylic resin or polyimide.

BRIEF EXPLANATION OF DRAWINGS

FIG. 3A is a plan view of the display device in the embodiment according to the present invention;

FIG. 3B is a cross-sectional view of the display device in the embodiment according to the present invention;

FIG. 5A is a plan view of a terminal unit of the display device in embodiment 1 according to the present invention;

FIG. 8A is a plan view of a terminal unit of the display device in embodiment 2 according to the present invention;

DESCRIPTION OF EMBODIMENTS

The present invention has an object of solving the above-described problems and providing a display device that keeps a high yield of mounting an external circuit and thus having a high reliability, and a method of manufacturing such a display device. The present invention also has an object of realizing such a display device by a simple manufacturing method without significantly changing an existing manufacturing method.

Hereinafter, embodiments of a display device according to the present invention will be described with reference to the attached drawings. The display device according to the present invention is not limited to the following embodiments, and may be carried out in any of various modifications.

Figure 1:
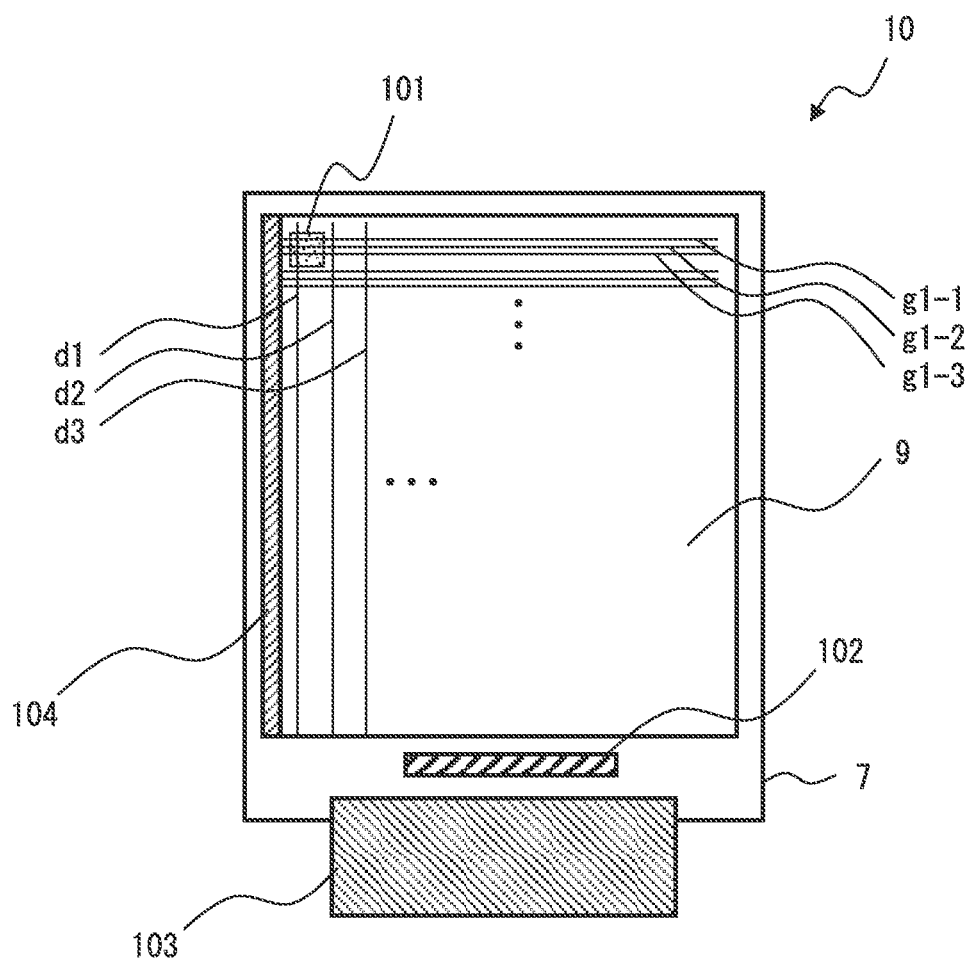
FIG. 1 is a plan view showing a schematic structure of a display device in an embodiment according to the present invention.

FIG. 1 shows a schematic structure of a display device 10 in an embodiment according to the present invention. The display device 10 in this embodiment includes a substrate 7, and also includes a display unit 9 including a plurality of pixels 101, a driver IC 102, an external circuit 103 (ex. a flexible printed circuit), and a scanning driving circuit 104 that are provided on the substrate 7. The display unit 9 includes a plurality of control signal lines g1-1 through g1-3 running in a horizontal direction in FIG. 1, and a plurality of data signal lines dl through d3 running in a vertical direction in FIG. 1. The control signal lines g1-1 through g1-3 and the data signal lines dl through d3 cross each other. At intersections of the control signal lines g1-1 through g1-3 and the data signal lines dl through d3, the plurality of pixels 101 are located; namely, the plurality of pixels 101 are located in a matrix.

In FIG. 1, three control signal lines g1-1 through g1-3 and one data signal line dl are provided as crossing each other for one pixel 101. The present invention is not limited to such a structure. A line that supplies a certain voltage, such as a power supply line or the like, may be included in the display unit 9. At each pixel 101, a pixel circuit is provided. The pixel circuit includes a thin film transistor that controls write of data voltages in accordance with control signals supplied from the control signal lines g1-1 through g1-3 and thus controls light emission of the pixel 101; a capacitance element that stores a data voltage supplied from a corresponding data signal line among the data signal lines dl through d3; and the like.

On the substrate 7, a plurality of line patterns are provided. The plurality of line patterns supply power source voltages and driving signals to the driving circuit 104 and also are connected to the earth. In FIG. 1, the display device 10 includes one driving circuit 104. Alternatively, the display device 10 may include a plurality of driving circuits 104 in a peripheral area along the display unit 9. Ends of the plurality of line patterns are respectively connected to a plurality of terminals provided on the substrate 7. The plurality of terminals are connected to the external circuit 103 that supplies a driving power, a driving signal, a ground potential and the like from an external device. The external circuit 103 may be a flexible printed circuit (FPC).

Figure 2:
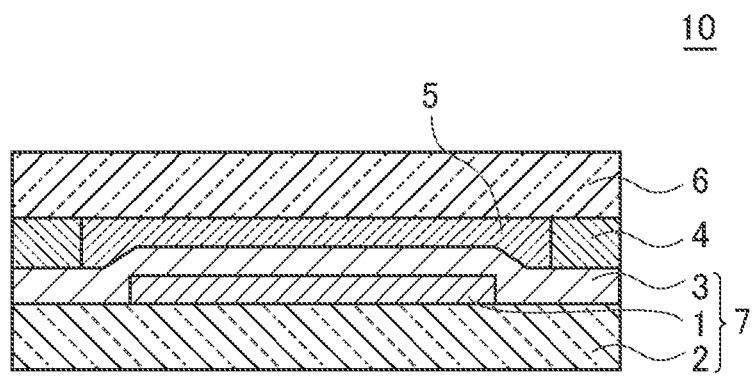
FIG. 2 is a vertical cross-sectional view showing a schematic structure of the display device in the embodiment according to the present invention.
Figure 3C:
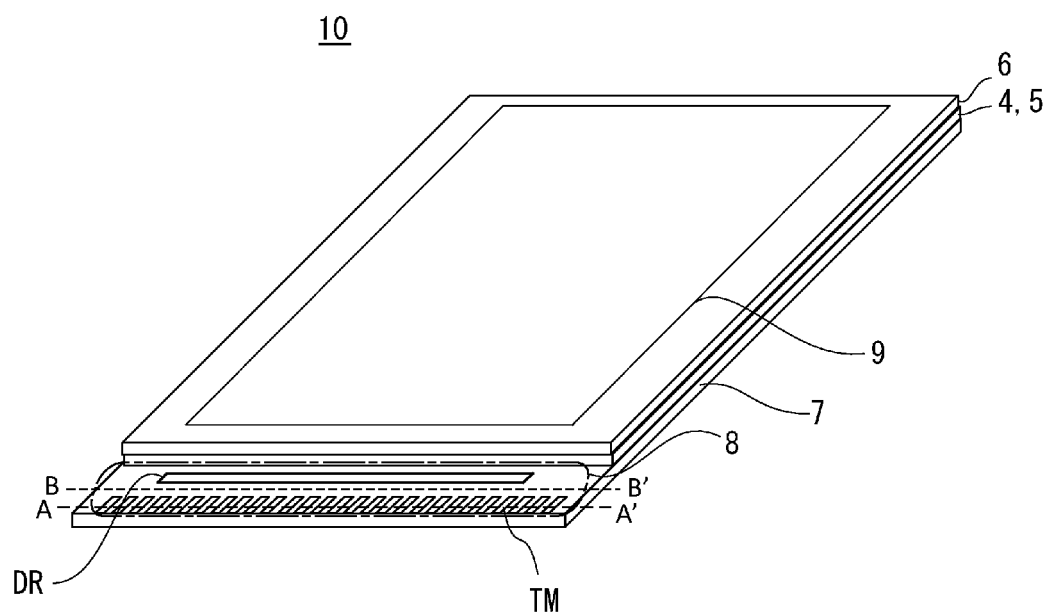
FIG. 3C is an isometric view showing a schematic structure of the display device in the embodiment according to the present invention.

Hereinafter, with reference to FIG. 2, FIG. 3A, FIG. 3B and FIG. 3C, the structure of the display device 10 in this embodiment according to the present invention will be described in more detail. FIG. 2 is a vertical cross-sectional view showing the display device 10 in this embodiment according to the present invention. FIG. 3A is a plan view of the display device 10, and FIG. 3B is a cross-sectional view of the display device 10. FIG. 3C is an isometric view showing a schematic structure of the display device in this embodiment according to the present invention.

In the following, an organic EL display device including an organic EL light emitting layer 1 will be described as an example of display device in this embodiment according to the present invention. The display device 10 in this embodiment is applicable to any flat panel display device such as, for example, a liquid crystal display device, a self-light emitting display device, or an electronic paper-type display device including an electrophoretic element or the like. For example, the display device 10 may be a liquid crystal display device including the substrate 7, a counter substrate facing the substrate 7, a liquid crystal layer located between the substrate 7 and the counter substrate for each pixel 101, and a backlight unit that supplies light to the liquid crystal layer.

As shown in FIG. 2, the display device 10 in this embodiment according to the present invention may include, on a substrate 2 formed of a hard material such as glass or the like, the organic EL light emitting layer 1 that forms each pixel 101 included in the display unit 9. Although not shown in detail in FIG. 2, the organic EL light emitting layer 1 may include, for example, a TFT driving circuit layer, a reflective electrode, an organic EL layer, and a transparent electrode that are stacked in this order from the side of the substrate 2. The organic EL layer may optionally include functional layers such as, for example, a hole injection layer, a hole transport layer, an electron transport layer and an electron injection layer stacked in addition to the light emitting layer.

The organic EL light emitting layer 1 is rapidly deteriorated when being exposed to moisture, and therefore needs to be shielded against external air. For this purpose, a surface of the organic EL light emitting layer 1 is covered with a transparent sealing film 3 formed of, for example, a silicon nitride film formed by CVD or the like, and also is covered with a substrate 6 formed of a transparent hard material such as glass or the like. Hereinafter, a structural body including the substrate 2 and also the organic EL light emitting layer 1 and the sealing film 3 formed on the substrate 2 will be referred to as a "first substrate 7", and a substrate facing the first substrate 7 will be referred to as a "second substrate 6". The second substrate 6 may include a color filter or include, for example, a thin film device having a touch panel function in accordance with the specifications of the display device 10.

As shown in FIG. 2, the display device 10 includes transparent resins 4 and 5 such as, for example, an epoxy resin or the like between the first substrate 7 and the second substrate 6. The resins 4 and 5 keep the distance between the first substrate 7 and the second substrate 6, and thus keep the surface of the organic EL light emitting layer 1 and a surface of the second substrate 6 parallel to each other. The resins 4 and 5 also have a role of preventing light reflection or refraction at the surface of the organic EL light emitting layer 1 and the surface of the second substrate 6. Instead of the resins 4 and 5, a known member such as a sealing member or the like may be used to keep the distance between the first substrate 7 and the second substrate 6. In a structure in which the distance between the first substrate 7 and the second substrate 6 is kept by the sealing member or the like, a gap may be provided between the first substrate 7 and the second substrate 6. The first substrate 7 and the second substrate 6 are joined together with such elements sandwiched therebetween, and thus the display device 10 is formed.

As shown in FIG. 3A, FIG. 3B and FIG. 3C, the display device 10 having the above-described structure includes the display unit 9 including the plurality of pixels 101 to display an image, and also includes a terminal unit 8 including a plurality of terminals TM that are used to provide electric connection with the external circuit 103.

As shown in FIG. 3A, FIG. 3B and FIG. 3C, in the terminal unit 8, the plurality of terminals TM are exposed without being covered with any of the sealing film 3, the resins 4 and 5 and the second substrate 6 shown in FIG. 2. Ends of the plurality of terminals TM that are thus exposed are connected to, for example, the external circuit 103 (see FIG. 1) that supplies a driving signal. The plurality of terminals TM are also connected to the thin film transistors and the like included in the organic EL light emitting layer 1 via the lines, a driver circuit DR and the like formed on the substrate 2. The driver circuit DR shown in FIG. 3A, FIG. 3B and FIG. 3C correspond to the driver IC 102 in FIG. 1.

In the case where the sealing film 3 that covers the organic EL light emitting layer 1 is provided on the entire surface of the substrate 2 without being patterned in such a method of manufacturing the display device 10, the plurality of terminals TM in the terminal unit 8 need to be exposed from the sealing film 3. According to a known method for exposing the plurality of terminals TM, after the sealing film 3 is formed on the terminal unit 8, the sealing film 3 on the terminal unit 8 is removed by tape-peeling or etching (dry etching or wet etching).

In order to prevent deterioration of the terminal unit 8, a protective film formed of an inorganic insulating film such as a silicon nitride film or the like may be formed on the plurality of terminals TM and the lines. In the case where the protective film for the terminal unit 8 is formed of an inorganic insulating film, the protective film may possibly be removed when the sealing film 3 on the terminal unit 8 is removed by etching because the sealing film 3 is also formed of an inorganic insulating film.

In order to prevent this, a conventional display device does not include the protective film on the plurality of terminals and the lines. A structure of a terminal unit of such a conventional display device will be described with reference to FIG. 10.

Figure 10:
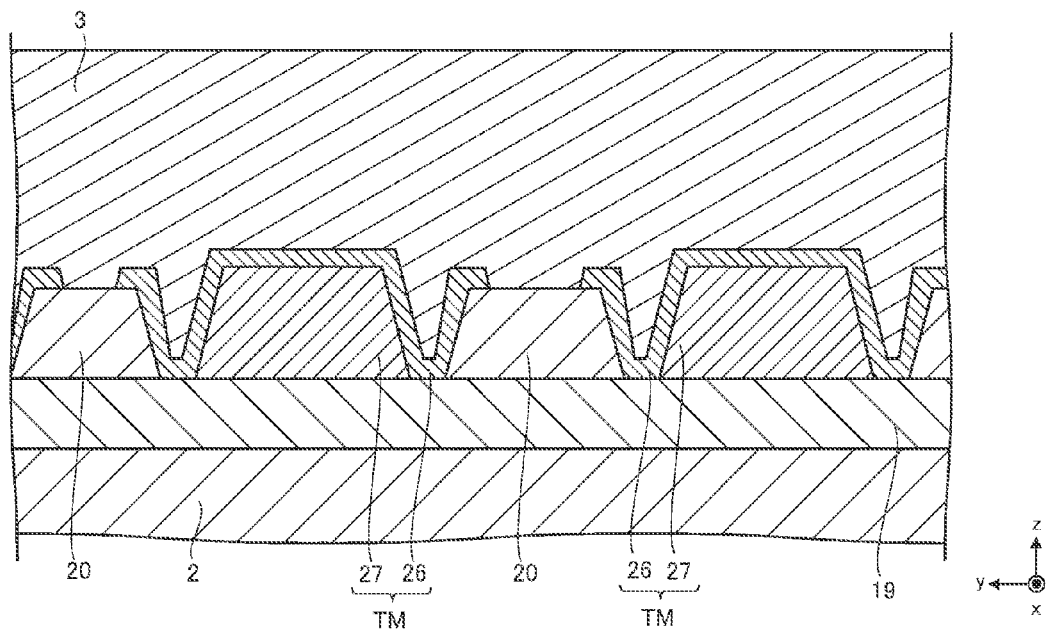
FIG. 10 is a cross-sectional view showing a schematic structure of a conventional display device.

FIG. 10 is a cross-sectional view showing a schematic structure of the terminal unit of the conventional display device, and shows a cross-sectional structure of two terminals TM taken along line corresponding to line A-A' in FIG. 3C. The terminals TM are formed on a first insulating film 19 that is formed on the substrate 2 so as to be insulated from each other by a second insulating film 20. Namely, each of the terminals TM is formed between two separate parts of the second insulating film 20. The first insulating film 19 and the second insulating film 20 may be formed of a silicon oxide film, a silicon nitride film or the like. Alternatively, the first insulating film 19 and the second insulating film 20 may be formed of an insulating film referred to as an undercoat film or an interlayer insulating film that is formed in a step of forming thin film transistors of the pixels 101.

The terminals TM and the lines connected to the terminals TM are formed as follows. First, protrusions (line patterns) 27 that are higher than the second insulating film 20 are formed of a metal material having a low resistance such as aluminum or the like. Then, a transparent conductive film 26 such as an ITO film or the like is formed so as to cover the protrusions 27. In this manner, the terminals TM and the lines including the protrusions 27 and the transparent conductive film 26 are formed. The sealing film 3 is formed on the terminals TM and the lines, namely, on a surface of the transparent conductive film 26. However, in such a conventional display device including the terminals TM and the lines formed in this manner, when the sealing film 3 is removed, the protrusions 27 formed of a metal material such as aluminum or the like may possible be exposed from the transparent conductive film 26 formed on edges of the protrusions 27. When this occurs, the reliability of the display device 10 is spoiled.

In order to prevent this, an organic insulating film may be used as a protective film that protects the plurality of terminals TMs. The organic insulating film is formed of an organic material such as, for example, an acrylic resin, polyimide or the like. However, such an organic insulating film is difficult to be controlled in terms of the thickness, and may possibly provide a stepped portion between contact surfaces of the terminals TM and the protective film. In addition, in the case where an organic insulating film is used as the protective film for the terminals TM, the shape of conductive particles of an anisotropic conductive film (ACF) that is used for mounting the external circuit 103 may possibly be restricted to cause a mounting flaw, depending on the thickness of the organic insulating film.

In such a situation, the present inventor made studies on a method that can protect the plurality of terminals TM in the terminal unit 8 without influencing the mounting of the external circuit 103 or the like, and achieved the present invention.

Embodiment 1

Figure 4:
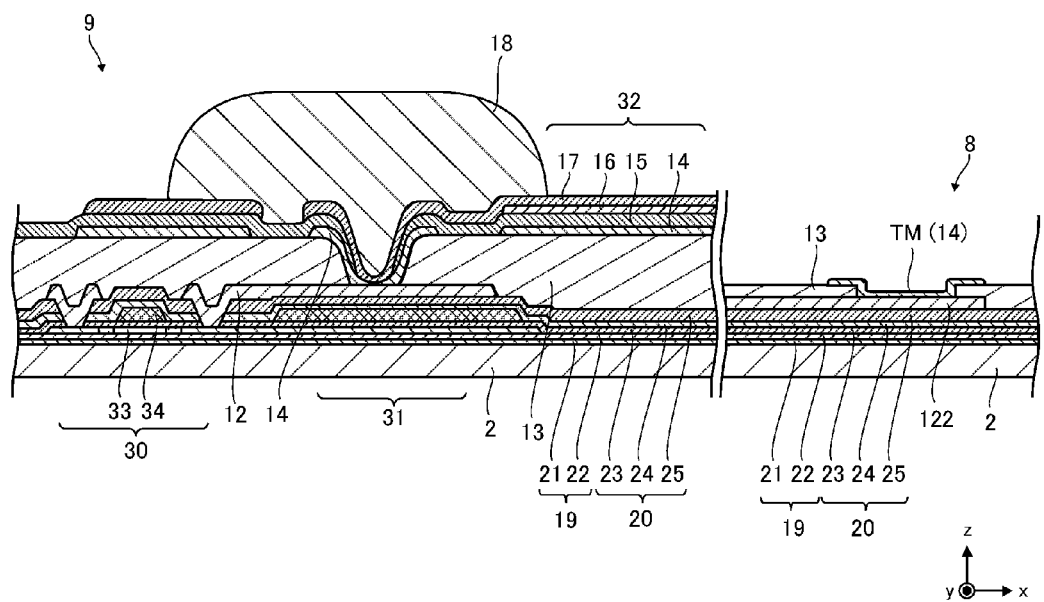
FIG. 4 is a cross-sectional view showing a schematic structure of a display device in embodiment 1 according to the present invention.
Figure 5B:
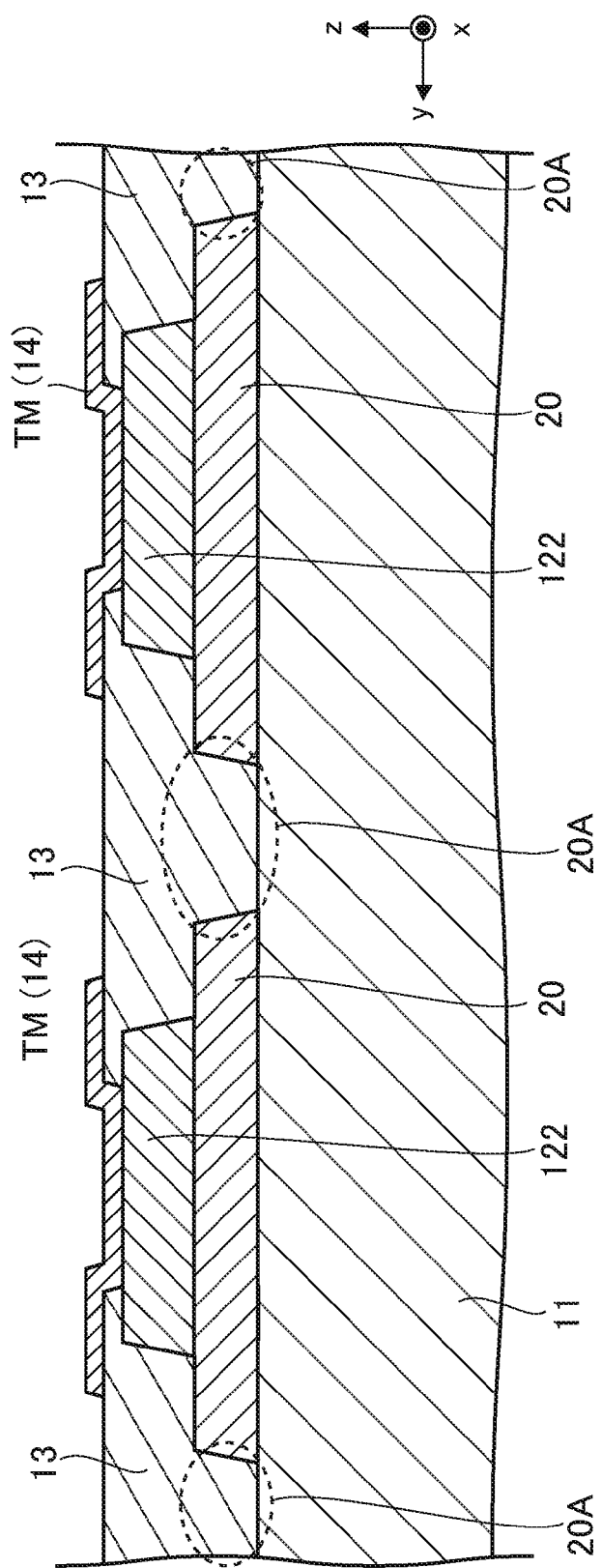
FIG. 5B is a cross-sectional view of the terminal unit of the display device in embodiment 1 according to the present invention.
Figure 6:
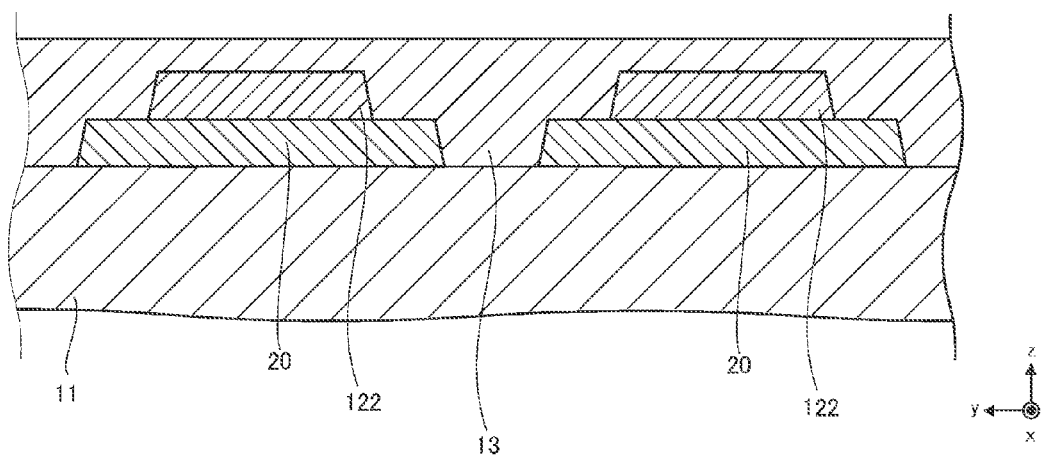
FIG. 6 is a cross-sectional view showing a schematic structure of a wiring unit of the display device in embodiment 1 according to the present invention.

Hereinafter, with reference to FIG. 4 through FIG. 6, a schematic structure of a display device 10 in embodiment 1 according to the present invention will be described. FIG. 4 is a cross-sectional view showing a schematic structure of the display device 10 in embodiment 1 according to the present invention. FIG. 5A and FIG. 5B show schematic structures of the terminal unit 8 of the display device 10 in embodiment 1 according to the present invention. FIG. 5A is a plan view of the terminal unit 8, and FIG. 5B is a cross-sectional view of the terminal unit 8. FIG. 6 is a cross-sectional view showing a schematic structure of a wiring unit of the display device 10 in embodiment 1 according to the present invention.

In the following, an organic EL display device including an organic EL light emitting layer 1 will be described as an example of display device in this embodiment according to the present invention. The display device 10 in this embodiment is applicable to any display device that controls display gray scale of each of pixels by use of a thin film transistor. As described above, the display device 10 in this embodiment is applicable to any flat panel display device such as, for example, a liquid crystal display device, a self-light emitting display device, or an electronic paper-type display device including an electrophoretic element or the like.

Elements that are substantially the same as those of the elements described above with reference to FIG. 1 through FIG. 3C will bear the same reference signs therewith, and detailed descriptions thereof will be omitted.

Among areas of the terminal unit 8 and areas of the display unit 9 of the display device 10 in embodiment 1 according to the present invention, FIG. 4 shows one area of the terminal unit 8 corresponding to one terminal and one area of the display unit 9 corresponding to one pixel 101. However, in actuality, the terminal unit 8 includes a plurality of terminals, and the display unit 9 includes a plurality of pixels 101. As shown in FIG. 4, one area of the terminal unit 8 corresponding to one pixel 101 includes a transistor unit 30 including a thin film transistor, a capacitance unit 31 including a capacitance element that stores a voltage from a signal line 12, and a pixel unit 32 that is a light emitting area of the pixel 101.

As shown in FIG. 4, on the substrate 2, the first insulating film 19 including two insulating films 21 and 22 are formed. The insulating films 21 and 22 are formed of a silicon oxide film, a silicon nitride film or the like below the thin film transistor. On the first insulating film 19, a polycrystalline silicon layer 33, a gate insulating film 23, and a gate electrode layer 34 are formed. The polycrystalline silicon layer 33 is partially doped with impurities, and a drain electrode and a source electrode are connected to the doped region, so that the thin film transistor is formed. On the thin film transistor, two insulating films 24 and 25 are formed as inter-layer insulating films. The insulating films 24 and 25 are formed of a silicon oxide film, a silicon nitride film or the like. In a part of the terminal unit 8 and a part of the display unit 9, the gate insulating film 23 and the two insulating films 24 and 25 form the second insulating film 20. In the structure shown in FIG. 4, the first insulating film 19 includes two layers and the second insulating film 20 includes three layers. The present invention is not limited to such a structure. For example, the second insulating film 20 may include the insulating films 24 and 25 that are formed on the thin film transistor and does not need to include the gate insulating film 23. In this case, the gate insulating film 23 is formed only on the polycrystalline silicon layer 33.

In the second insulating film 20, a contact hole 50 that exposes at least a part of the thin film transistor is formed. In the display unit 9, the signal line 12 is formed on the second insulating film 20, and the signal line 12 is connected to the thin film transistor via the contact hole 50. The signal line 12 connected to the thin film transistor is covered with a third insulating film 13 that is formed of an organic insulating film. On the third insulating film 13, a first conductive film 14 connected to the signal line 12 via a contact hole formed in the third insulating film 13 is formed. On the first conductive film 14, a fourth insulating film 15 is formed. On the fourth insulating film 15, a reflective electrode 16 and a second conductive film 17 are formed. The first conductive film 14, the fourth insulating film 15 and the second conductive film 17 form a capacitance element connected to the capacitance unit 31 in parallel. The first conductive film 14 is formed of a light-transmissive conductive film such as an ITO film or the like. The fourth insulating film 15 is formed of an inorganic film such as a silicon nitride film or the like. The second conductive film 17 is formed of a light-transmissive conductive film such as an ITO film or the like. The fourth insulating film 15 has an opening in at least the contact hole, and the first conductive film 14 and the second conductive film 17 are connected to each other via the opening.

In an example of the pixel unit 32 shown in FIG. 4, the reflective electrode 16 containing aluminum, silver or the like is located below the second conductive film 17 to form an anode electrode (positive electrode, reflective electrode) of the organic EL light emitting layer 1. The present invention is not limited to such a structure. Although not shown in FIG. 4, in actuality, an organic EL layer and a transparent electrode (negative electrode) are formed on the second conductive film 17 to form the organic EL light emitting layer 1. On the second conductive film 17, a fifth insulating film 18 of an organic insulating film is formed as a bank layer that demarcates the pixels 101.

In the meantime, in the terminal unit 8 shown in FIG. 4, a terminal line 122 is formed on the second insulating film 20. The terminal line 122 is covered with the third insulating film 13. A part of the third insulating film 13 that is on the terminal line 122 is removed, and a part of the terminal line 122 is exposed from the third insulating film 13. On the exposed part of the terminal line 122, the first conductive film 14 formed of a light-transmissive conductive film such as an ITO film or the like is formed so as to cover a part of the third insulating film 13. As described above, the first conductive film 14 forms a capacitance element in the display unit 9. As can be seen, the terminal unit 8 includes the first conductive film 14 that forms the plurality of terminals TM described above and shown in FIG. 3A, FIG. 3B and FIG. 3C.

Hereinafter, with reference to FIG. 5A, FIG. 5B and FIG. 6, steps for manufacturing the plurality of terminals TM and the lines in the terminal unit 8 will be described in detail.

FIG. 5B shows a cross-sectional structure of two terminals TM in the terminal unit 8 that is taken along a line corresponding to line A-A' in FIG. 3B. FIG. 5A shows a planar structure of the two terminals TM shown in FIG. 5B. FIG. 6 shows a cross-sectional structure of two terminal lines 122 in the wiring unit of the display device 10 that is taken along a line corresponding to line B-B' in FIG. 3C.

A substrate 11 shown in FIG. 5B and FIG. 6 corresponds to an assembly of the substrate 2 and the first insulating film 19 formed on the substrate 2 shown in FIG. 4. In the terminal unit 8, the second insulating film 20 is formed on the substrate 11 by use of the same material as that of the interlayer insulating film as described above. A part of the second insulating film 20 formed on the substrate 11 that is enclosed by a dashed line 20A in FIG. 5B is removed by a known method such as etching or the like. As a result, an opening is formed where the terminal line 122 is not located. This etching step performed on the second insulating film 20 in the terminal unit 8 can be performed at the same time as an etching step performed on the interlayer insulating film (second insulating film 20) of the thin film transistor in the display unit 9. The two etching steps can be performed by use of one mask. In this step, in the display unit 9, the second insulating film 20 is etched at parts on electrodes of the plurality of thin film transistors, so that a plurality of contact holes 50 are formed in the second insulating film 20. Via the plurality of contact holes 50 thus formed in the second insulating film 20 allows a plurality of the signal lines 12 and the plurality of thin film transistors to be respectively connected to each other in a connection step described below.

The shape of the opening that is formed by patterning and partially removing the second insulating film 20 is not limited to the shape enclosed by the dashed line 20A shown in FIG. 5B. In a later manufacturing step, a solution is applied such that the third insulating film 13 to be formed on the second insulating film 20 has a desired thickness. The shape of the opening may be determined in accordance with the amount of the solution. Depending on the amount of the solution used to form the third insulating film 13, the second insulating film 20 in the terminal unit 8 may have a part that is not removed even though the terminal line 122 is not formed on the part. As can be seen, the present invention is not limited to the structure shown in FIG. 5B.

Next, the signal line 12 and the terminal line 122 are formed of a metal material such as aluminum or the like on the second insulating film 20. The signal line 12 and the terminal line 122 are formed by providing a metal film on the second insulating film 20 and patterning the metal film. In the display unit 9 and the terminal unit 8, the signal line 12 and the terminal line 122 are formed at the same time by use of one mask. As a result of this step, as shown in FIG. 4, the signal line 12 connected to the source/drain electrode of the thin film transistor via the contact hole 50 in the second insulating film 20 is formed in the display unit 9. As shown in FIG. 5B and FIG. 6, the terminal line 122 is formed on the second insulating film 20 in the terminal unit 8.

Next, the third insulating film 13 is formed on, and covers, the signal line 12 and the terminal line 122 is formed in the display unit 9 and the terminal unit 8. The third insulating film 13 is formed of an organic material such as an acrylic resin, polyimide or the like. In this step, in the terminal unit 8, the opening formed by removing the second insulating film 20 is filled with the organic material for the third insulating film 13. The surface area of the opening in the second insulating film 20 (surface area of the part of the substrate 11 that is exposed by the opening) is optimized so that the third insulating film 13 to be formed on the terminal line 122 can have a desired thickness.

It is now assumed that the third insulating film 13 to be formed on the terminal line 122 is a thin film having a thickness of 1 µm or less. If the thickness of the third insulating film 13 is controlled only by fine-tuning the amount of the organic material without removing a part of the second insulating film 20, the thickness needs to be controlled at high precision, as compared with the method in this embodiment by which the second insulating film 20 is removed to expose a desired surface area of the substrate 11 and then the organic material is applied to control the thickness of the insulating film 13. In this embodiment, a part of the second insulating film 20 is removed in advance, and this makes it easier to control the thickness of the third insulating film 13. The step of removing a part of the second insulating film 20 can be performed at the same time as the step of patterning the interlayer insulating film (second insulating film 20) of the thin film transistor in the display unit 9. Therefore, the third insulating film 13 having a desired thickness can be formed on the terminal line 122 in a simple manufacturing method with no need to significantly change an existing manufacturing method.

As a result of such a step, the third insulating film 13 is formed as a protective film that covers the terminal line 122. As shown in FIG. 5 B, the third insulating film 13 is partially removed by etching to form a contact hole (through-hole) that exposes the terminal line 122. On the part of the terminal line 122 that is exposed by the contact hole, a light-transmissive conductive film such as an ITO film or the like is formed and patterned. Thus, the plurality of terminals TM are formed as parts of the first conductive film 14. A stepped portion is formed in the first conductive film 14 between a surface of a part thereof that is in contact with the terminal line 122 and a surface of a part thereof that is on the third insulating film 13. However, in this embodiment, such a stepped portion formed in the first conductive film 14 can have a thickness of about 1 μm or less.

As can be seen, in this embodiment, the stepped portion formed in the first conductive film 14 that forms the terminals TM can be as thin as about 1 μm or less. Because of this, the anisotropic conductive film (ACF) used to mount the external circuit 103 on the terminal unit 8 may be of a type formed of small-diameter conductive particles. This can decrease the connection resistance of the terminal TM. This will be described in more detail. If the stepped portion in the terminal TM is greater than 1 μm, the conductive particles of the anisotropic conductive film (ACF) cannot be squashed properly, which may cause a flaw such as a line defect or the like. In order to avoid this, an anisotropic conductive film (ACF) formed of large-diameter conductive particles needs to be used. However, when such an anisotropic conductive film (ACF) formed of large-diameter conductive particles is used, there may occur other problems that the line pitch cannot be made narrow and that the number of particles per unit surface area is decreased to reduce the connection surface area, which raises the connection resistance. In this embodiment, the thickness of the third insulating film 13 is controlled such that the stepped portion formed in the first conductive film 14 has a thickness of about 1 μm or less. This allows an anisotropic conductive film (ACF) formed of small-diameter conductive particles to be used, which decreases the connection resistance. Thus, generation of the mounting flaw can be prevented.

In this embodiment, the third insulating film 13 provided as a protective film on the terminal TM and the terminal line 122 is formed of an organic material. Such a protective film formed of an organic material has a high water resistance and thus prevents the terminal TM and the terminal line 122 from being corroded. This can improve the connection reliability in the terminal unit 8.

As described above, in this embodiment, the terminals TM and the terminal lines 122 in the terminal unit 8 are protected by the third insulating film 13 formed of an organic material, and the third insulating film 13 can be formed to have a desired thickness. Therefore, the yield of mounting the external circuit 103 is not decreased, which provides a high reliability of the display device. Such a display device can be manufactured by a simple manufacturing method with no need to significantly change an existing manufacturing method.

Embodiment 2

Figure 7:
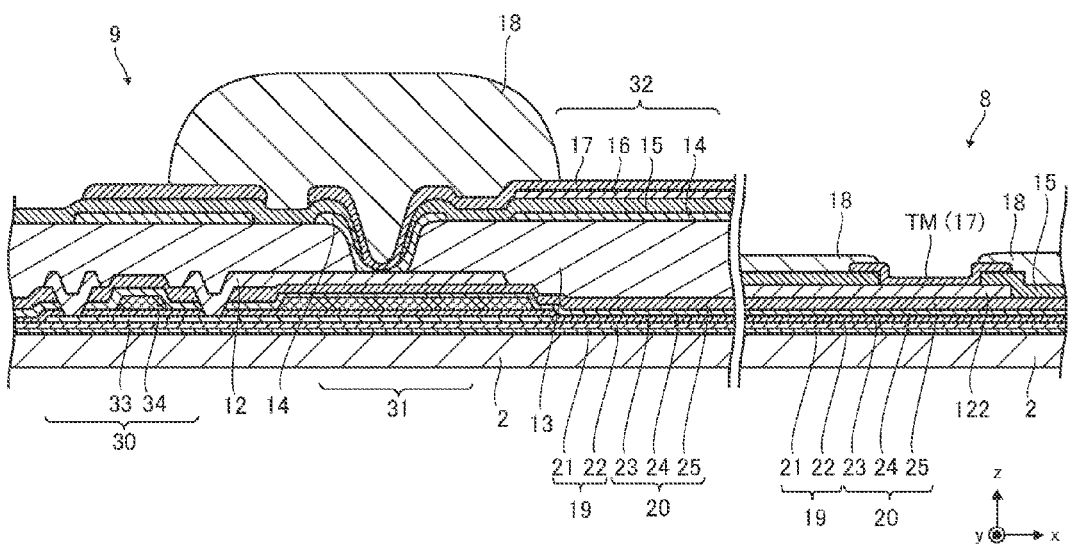
FIG. 7 is a cross-sectional view showing a schematic structure of a display device in embodiment 2 according to the present invention.
Figure 8B:
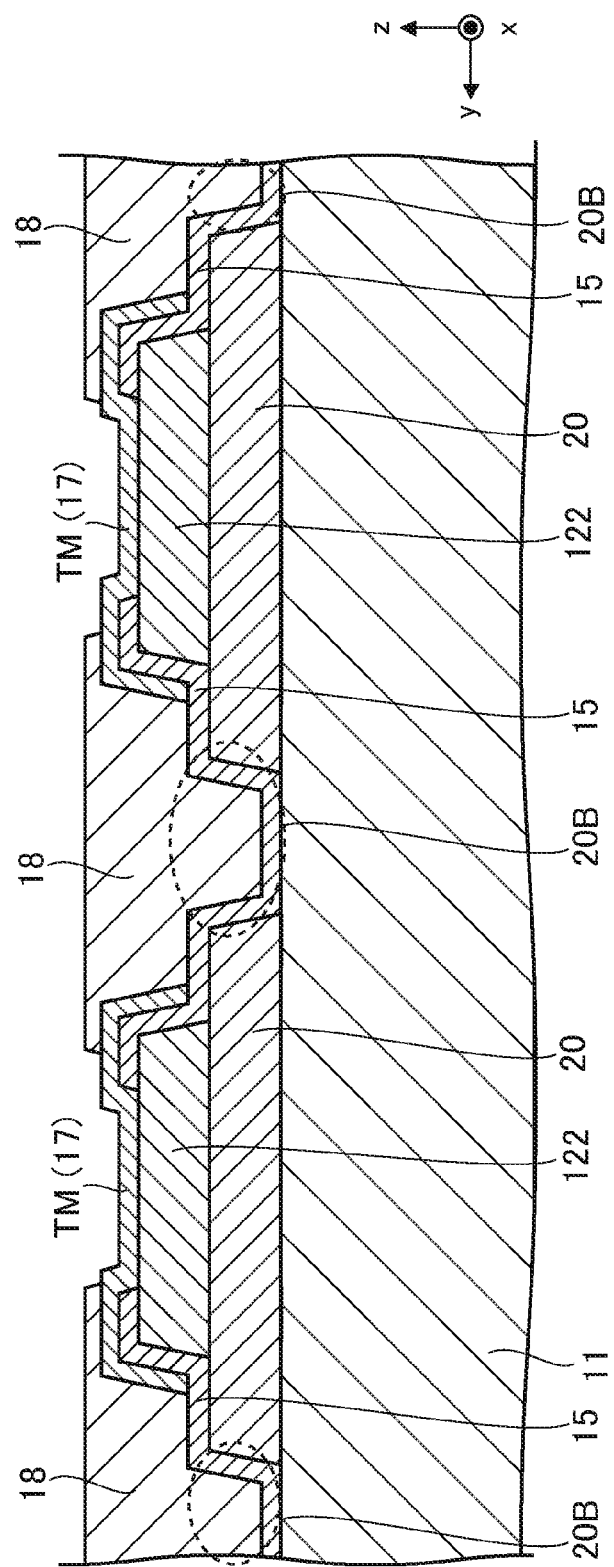
FIG. 8B is a cross-sectional view of the terminal unit of the display device in embodiment 2 according to the present invention.
Figure 9:
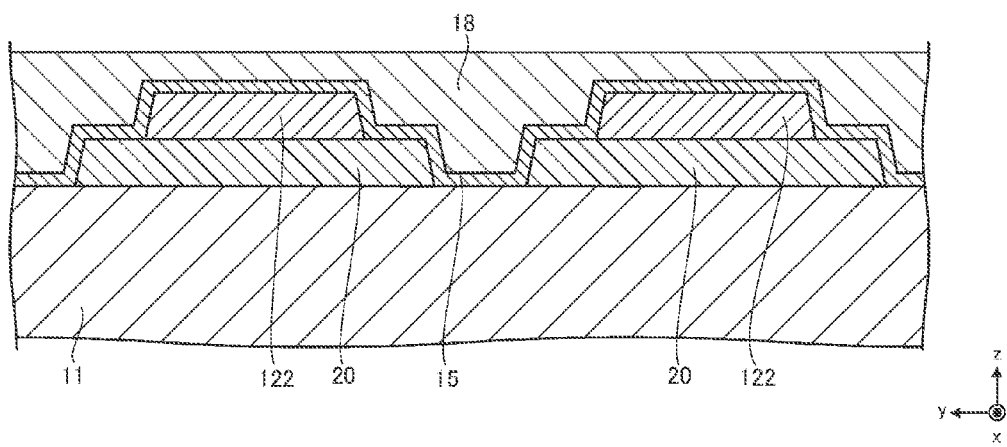
FIG. 9 is a cross-sectional view showing a schematic structure of a wiring unit of the display device in embodiment 2 according to the present invention.

Hereinafter, with reference to FIG. 7 through FIG. 9, a schematic structure of a display device 40 in embodiment 2 according to the present invention will be described. FIG. 7 is a cross-sectional view showing a schematic structure of the display device 40 in embodiment 2 according to the present invention. FIG. 8A and FIG. 8B show schematic structures of the terminal unit 8 of the display device 40 in embodiment 2 according to the present invention. FIG. 8A is a plan view of the terminal unit 8, and FIG. 8B is a cross-sectional view of the terminal unit 8. FIG. 9 is a cross-sectional view showing a schematic structure of the wiring unit of the display device 40 in embodiment 2 according to the present invention.

Unlike the display device 10 in embodiment 1 according to the present invention, the display device 40 in embodiment 2 according to the present invention includes a protective film formed of an inorganic insulating film below the third insulating film 13 formed of an organic insulating film. Elements that are substantially the same as those of the elements in embodiment 1 described above with reference to FIG. 4 through FIG. 6 will bear the same reference signs therewith, and detailed descriptions thereof will be omitted.

As shown in FIG. 7, in the display device 40 in embodiment 2 according to the present invention, the first insulating film 19 and the second insulating film 20 are formed on a substrate 2, like in the display 10 in embodiment 1 according to the present invention. In the terminal 8, a part of the second insulating film 20 that is enclosed by a dashed line 20B in FIG. 8B, namely, a part of the second insulating film 20 where the terminal line 122 is not to be formed, is removed by a known method such as etching or the like to form an opening, like in the display device 10 in embodiment 1 according to the present invention. This etching step can be performed at the same time as the etching step performed on the interlayer insulating film (second insulating film 20) of the thin film transistor in the display unit 9.

After the metal film formed on the second insulating film 20 is patterned to form the signal line 12 and the terminal line 122, the fourth insulating film 15 is formed of an inorganic insulating film so as to cover the second insulating film 20 as well as the signal line 12 and the terminal line 122. In the display unit 9, the fourth insulating film 15 forms a capacitance element of the capacitance unit 31, and is formed of an inorganic insulating film such as a silicon nitride film or the like.

Next, the fourth insulating film 15 on the terminal line 122 is partially removed by etching to expose the terminal line 122. On the exposed part of the terminal line 122, the second conductive film 17 is formed of a light-transmissive conductive film such as an ITO film or the like and patterned. Thus, a plurality of terminals TM are formed. The second conductive film 17 is formed so as to cover the exposed part of the terminal line 122 and a part of a surface of the fourth insulating film 15 that is in the vicinity thereof. The conductive film 17 may be a layer that forms an anode electrode (positive electrode) of the organic EL light emitting layer 1.

On the fourth insulating film 15 and the second conductive film 17 thus formed, the fifth insulating film 18 is formed of an organic material such as an acrylic resin, polyimide or the like. In the display unit 9, the fifth insulating film 18 acts as a bank layer that demarcates the pixels 101. In the terminal unit 8, the fifth insulating film 18 is patterned so as to expose a part of the second conductive film 17, the part acting as the terminal TM. Such a patterning performed on the fifth insulating film 18 can be performed at the same time as the patterning for forming the bank layer in the display unit 9.

In the terminal unit 8, the opening formed by removing a part of the second insulating film 20 (part enclosed by the dashed line 20B in FIG. 8B is filled with the fifth insulating film 18. Therefore, in this embodiment also, the surface area of the opening in the second insulating film 20 is optimized so that the fifth insulating film 18 to be formed on the second conductive film 17 can have a desired thickness, like in the method of manufacturing the display device 10 in embodiment 1. Thus, the stepped portion formed between the part of the second conductive film 17 acting as the terminal TM and the fifth insulating film 18 on the second conductive film 17 can be made thin so as not to influence the mounting of the external circuit 103, by a simple manufacturing method with no need to significantly changing an existing manufacturing method.

In this embodiment, the fourth insulating film 15 formed of an inorganic insulating film such as a silicon nitride film or the like protects the terminal line 122, and the fifth insulating film 18 formed of an organic insulating film is provided on the fourth insulating film 15. Therefore, the display device manufactured in this embodiment has a high water resistance, is prevented from being corroded, and has a higher reliability.

As described above, in embodiments 1 and 2 according to the present invention, the terminals TM and the terminal lines 122 in the terminal unit 8 are protected by the third insulating film 13 or the fifth insulating film 18 each of which is formed of an organic insulating film, and the third insulating film 13 and the fifth insulating film 18 are formed to have a desired thickness. Therefore, the yield of mounting the external circuit 103 is not decreased, which provides a high reliability of the display device. Such a display device can be manufactured by a simple manufacturing method with no need to significantly change an existing manufacturing method.

The invention claimed is:

1. A display device, comprising:
a display unit comprising a plurality of pixels respectively having thin film transistors;
a terminal unit comprising an array of a plurality of terminals, signals to control an operation of the thin film transistors respectively being input into the plurality of terminals;
a first insulating film provided on a substrate, wherein the thin film transistors provided on the first insulating film;
a second insulating film provided in the display unit and in the terminal unit, and having openings located between the terminals;
a plurality of signal lines provided on the second insulating film and respectively connected to the thin film transistors;
a plurality of terminal lines provided on the second insulating film in the terminal unit; and
a third insulating film located on the plurality of signal lines and the plurality of terminal lines and formed of an organic insulating film, wherein
each of the openings exposes at least a part of the top surface of the first insulating film from the second insulating film between the terminals.

2. The display device according to claim 1,
wherein the plurality of terminals are respectively connected to the plurality of terminal lines via a plurality of contact holes provided in the third insulating film.

3. The display device according to claim 1,
wherein the plurality of terminals are formed of a light-transmissive conductive film.

4. The display device according to claim 1,
wherein the third insulating film contains an acrylic resin or polyimide.

5. A display device, comprising:
a display unit comprising a plurality of pixels respectively having thin film transistors;
a terminal unit comprising an array of a plurality of terminals, signals to control an operation of the thin film transistors respectively being input into the plurality of terminals;
a first insulating film provided on a substrate, wherein the thin film transistors are provided on the first insulating film;
a second insulating film provided in the display unit and in the terminal unit, and having openings located between the terminals;
a plurality of signal lines provided on the second insulating film and respectively connected to the thin film transistors;
a plurality of terminal lines provided on the second insulating film in the terminal unit; a third insulating film located on the plurality of signal lines and formed of an organic insulating film;
a fourth insulating film formed from an inorganic insulating film located on the third insulating film and the plurality of terminal lines, having a plurality of contact holes each exposing a part of a corresponding terminal line among the plurality of terminal lines, wherein the plurality of terminals provided on the fourth insulating film and respectively connected to the plurality of terminal lines via the plurality of contact holes; and
a fifth insulating film provided on the plurality of terminals and exposing a part of each of the plurality of terminals, wherein
each of the openings exposes at least a part of the top surface of the first insulating film from the second insulating film between the terminals.

6. The display device according to claim 5,
wherein the plurality of terminals are formed of a light-transmissive conductive film.

7. The display device according to claim 5,
wherein the third insulating film contains an acrylic resin or polyimide.

8. The display device according to claim 1,
wherein the third insulating film is formed so as to overlap the openings.

9. The display device according to claim 5,
wherein the fourth insulating film and the fifth insulating film are formed so as to overlap the openings.

* * * * *